(12) United States Patent  
Kudo et al.

(10) Patent No.: US 11,067,602 B2  
(45) Date of Patent: Jul. 20, 2021

(54) ELECTRICAL CONNECTING APPARATUS

(71) Applicant: KABUSHI KAISHA NIHON MICRONICS, Tokyo (JP)

(72) Inventors: Toshiyuki Kudo, Tokyo (JP); Takayuki Narumi, Tokyo (JP); Yoshinori Kikuchi, Tokyo (JP); Takao Yasuta, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 97 days.

(21) Appl. No.: 16/677,887

(22) Filed: Nov. 8, 2019

(65) Prior Publication Data

US 2020/0191829 A1 Jun. 18, 2020

(30) Foreign Application Priority Data

Dec. 13, 2018 (JP) .............................. JP2018-233811

(51) Int. Cl.
*G01R 1/073* (2006.01)
*H01R 12/71* (2011.01)
(Continued)

(52) U.S. Cl.
CPC ..... *G01R 1/07342* (2013.01); *G01R 1/06722* (2013.01); *H01R 12/714* (2013.01); *H01R 13/24* (2013.01); *H01R 2201/20* (2013.01)

(58) Field of Classification Search
CPC ............ G01R 1/07342; G01R 1/06722; H01R 12/714
See application file for complete search history.

(56) References Cited

U.S. PATENT DOCUMENTS

2008/0157791 A1* 7/2008 Hobbs ................ G01R 1/07378  
324/756.03  
2014/0145741 A1 5/2014 Nakata et al.

FOREIGN PATENT DOCUMENTS

JP 2012-163410 A 8/2012

OTHER PUBLICATIONS

Search Report issued in corresponding Singapore Patent Appln. No. 10201910447X dated Aug. 5, 2020.

* cited by examiner

*Primary Examiner* — Paresh Patel  
(74) *Attorney, Agent, or Firm* — Bacon & Thomas, PLLC

(57) ABSTRACT

To maintain the horizontalness of a probe card even, if the number of measured DUTs is increased.

An electrical connecting apparatus according to the present, disclosure comprises a support member having a lower surface region in which a level part is formed and a wiring board provided adjacent to the lower surface of the support member, and to be connected to a testing device side. The electrical connecting apparatus comprises: a connection unit having multiple connection terminals; a probe substrate electrically connecting multiple probes to the connection terminals; multiple anchors arranged on the upper surface of the probe substrate; and multiple supports functioning as supports between corresponding ones of the anchors and the support member via the wiring board and the connection unit. The anchors and the supports are arranged at positions including: each vertex point of a square; each vertex point of two rectangles having respective two long sides passing through corresponding facing vertex points on one side and corresponding facing vertex points on the other side of the (Continued)

(A)

(B)

square; and multiple points along a virtual circle centered on the center of the square and having a diameter surrounding each of the rectangles.

4 Claims, 9 Drawing Sheets

(51) Int. Cl.
*G01R 1/067* (2006.01)
*H01R 13/24* (2006.01)

| | CONDITION 4-1 | CONDITION 4-2 |
|---|---|---|
| CONTACT LOAD | 2,942N (=300kgf) | 2,942N (=300kgf) |
| PRESENCE OR ABSENCE OF SUPPORT 233 | YES | YES |
| THE NUMBER OF SUPPORTS 233 | 20 | 20 |
| POSITION OF SUPPORT 233 ON OUTERMOST PREPHERY (ALONG VIRTUAL CIRCLE C) | OUTSIDE OF OUTER PERIPHERY OF CIRCULAR SPOT-FACING SECTION | INSIDE OF OUTER PERIPHERY OF CIRCULAR SPOT-FACING SECTION |
| DISPLACEMENT OF SUPPORT MEMBER 22 (Ø300 AREA) | 4.8um (5.3-0.5) | 4.5um (5.2-0.7) |
| PROBE CARD IN-PLANE DISPLACEMENT (Ø300 AREA) | 6.9um (9.5-2.6) | 5.8um (8.4-2.6) |

FIG. 8

ELECTRICAL CONNECTING APPARATUS

CROSS-REFERENCE TO RELATED APPLICATIONS

The present application claims, under 35 USC 119, priority of Japanese Patent Application No. 2018-233811 filed on Dec. 13, 2018.

FIELD OF THE INVENTION

The present disclosure relates to an electrical connecting apparatus, and is applicable to an electrical connecting apparatus to be used for an electrical conduction test on a semiconductor integrated circuit, for example.

Background Art

For electrical test on each semiconductor integrated circuit (test subject) formed on a semiconductor wafer, a testing device including a probe card with multiple probes (electrical contacts) provided at a test head is used.

For example, the probe card is attached to the test head of the testing device, and the tip of each probe appearing on the lower surface of the probe card is brought into electrical contact with each electrode terminal of each semiconductor integrated circuit. An electrical signal from a tester is supplied via the probe to the test subject, and a signal from the test subject is taken into the tester side via the probe. In this way, the test subject is subjected to the electrical test.

During the test, the semiconductor wafer is placed on a chuck surface, the probe card is pressed against the semiconductor wafer on the chuck surface, and the tip of each probe is brought into electrical contact with the electrode of the test subject.

At this time, the probe card pressed toward the semiconductor wafer receives reaction force. Hence, reducing deformation (deflection, for example) of the probe card is required. Further, to bring the tip of each probe into contact with the electrode of the test subject reliably, maintaining the horizontalness (parallelism) of the probe card is also required.

In a conventional existing case, one surface (upper surface, for example) of a probe substrate of a probe card is a plane, and this surface of the probe substrate is brought into contact with a testing device side when the probe card is attached to the testing device side. In this case, as the one surface of the probe substrate of the probe card contacts the testing device side, the one surface (contact surface) of the probe substrate functions as a reference surface for the horizontalness (parallelism) of the probe card, making it possible to stabilize the horizontalness of the probe card.

According to a disclosure of Patent literature 1, a connection unit including a pogo-pin block is provided on the lower surface of a test head, and a probe card, is connected to the connection unit when the probe card is attached to a testing device side. This connection unit is provided with anchor abutments with which multiple anchors attached to the upper surface of a wiring board of the probe card are to be brought into abutting contact. Each anchor adjusted in height is brought into abutting contact with a corresponding anchor abutment to attach the probe card to the connection unit, thereby maintaining the horizontalness (parallelism) of the probe card.

PRIOR ART LITERATURE

Patent Literature

Patent Literature 1: Japanese Patent Application Publication No. 2012-163410

SUMMARY OF INVENTION

Problem to be Solved by Invention

In response to higher levels of integration of semiconductor integrated circuits or narrower pitches between electrodes in recent years, for example, increasing the number of measured devices under test (DUTs) of a test subject has been desired in conducting an electrical test on the test subject using a testing device.

Meanwhile, increasing the number of measured DUTs causes increase in the number of probes fitted to a probe card. Hence, the probe card is to receive larger reaction force than in conventional cases when each probe is pressed against the test subject. This makes it more difficult to maintain the levelness of the probe card than in the conventional cases.

The present disclosure is intended to provide an electrical connecting apparatus capable of maintain the horizontalness of a probe card stably even if the number of probes is increased.

Means of Solving Problem

To solve the foregoing problem, an electrical connecting apparatus according to the present disclosure comprises a support member having a lower surface region in which a level part is formed and a wiring board provided adjacent to the lower surface of the support member. The electrical connecting apparatus is to be connected to a testing device side. The electrical connecting apparatus comprises: a connection unit provided adjacent to the lower surface of the wiring board and having multiple connection terminals; a probe substrate provided adjacent to the lower surface of the connection unit and electrically connecting multiple probes to electrically contact a test subject to the multiple connection terminals; multiple anchors arranged on the upper surface of the probe substrate; and multiple supports functioning as supports between corresponding ones of the multiple anchors on the probe substrate and, the level part of the support member via through holes at the wiring board and through holes at the connection unit. The multiple anchors and the multiple supports are arranged at positions including: each vertex point of a square; each vertex point of a first rectangle having two long sides passing through corresponding facing vertex points of the square on one side; each vertex point of a second rectangle having two long sides passing through corresponding facing vertex points of the square on the other side; and multiple points located at equal intervals along a virtual circle centered on a point of intersection of the diagonal lines of the square and having a diameter of a size surrounding the first rectangle and the second rectangle.

Advantageous Effects of Invention

According to the present disclosure, even if the number of probes is increased, the horizontalness of the probe card can still be maintained stably.

BRIEF DESCRIPTION OF DRAWINGS

FIG. 8 shows an FEM analysis result indicating a degree of deformation (displacement difference) of the probe card occurring when the probe card is attached to the tester side via the anchor and the support according to the embodiment (second analysis result)

EMBODIMENT FOR CARRYING OUT INVENTION

(A) Principal Embodiment

Figure 1:
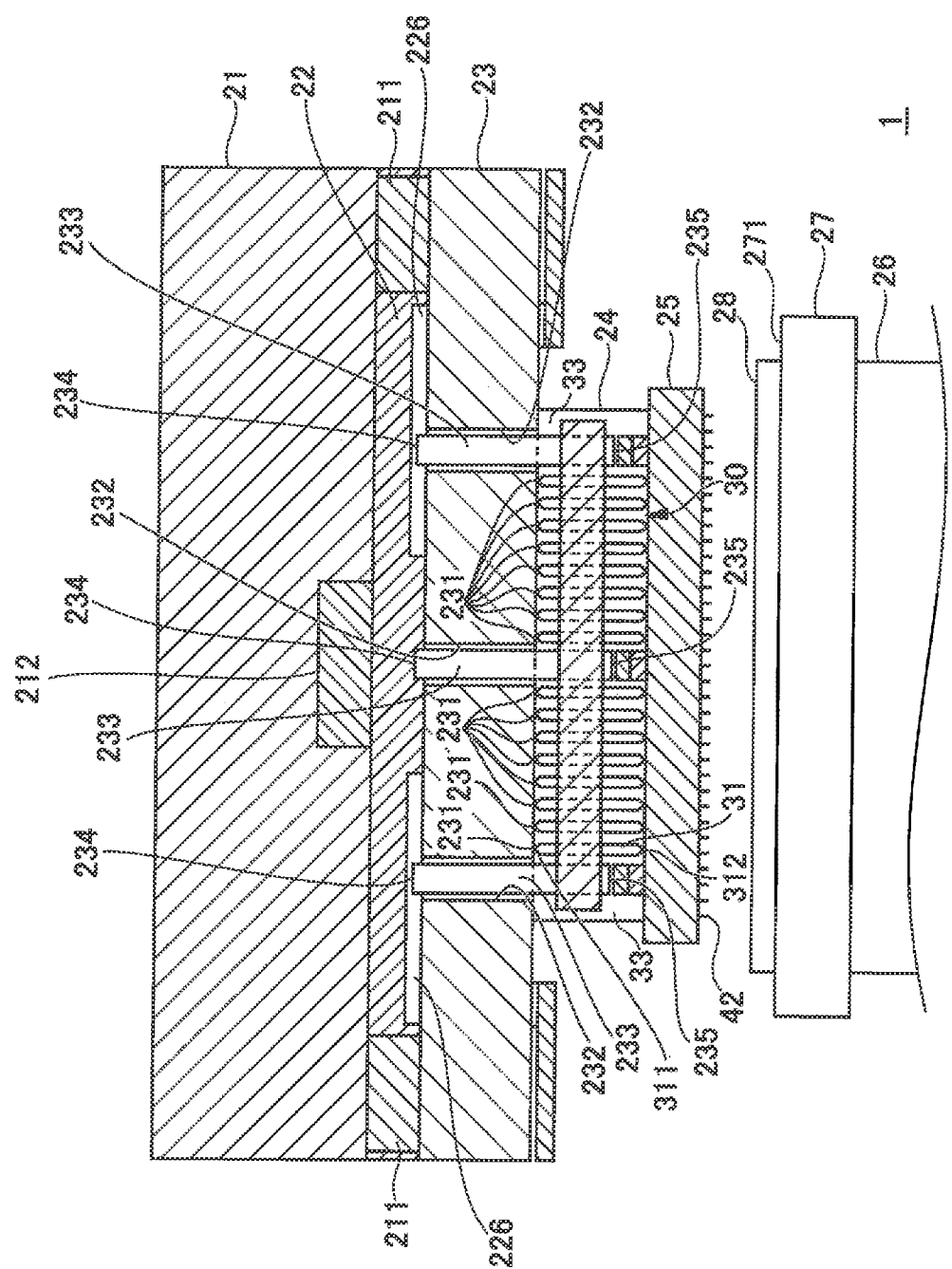
FIG. 1 is a configuration view showing principal structures of a testing device (hereinafter also called a tester) according to an embodiment.

An embodiment of an electrical connecting apparatus according to the present disclosure will be described in detail below by referring to the drawings.

In an example described in this embodiment, the electrical connecting apparatus according to the present disclosure is applied to a probe card used in a testing device for a test on multiple semiconductor integrated circuits as test subjects formed on a semiconductor wafer.

(A1) Configuration of Embodiment

Figure 2:
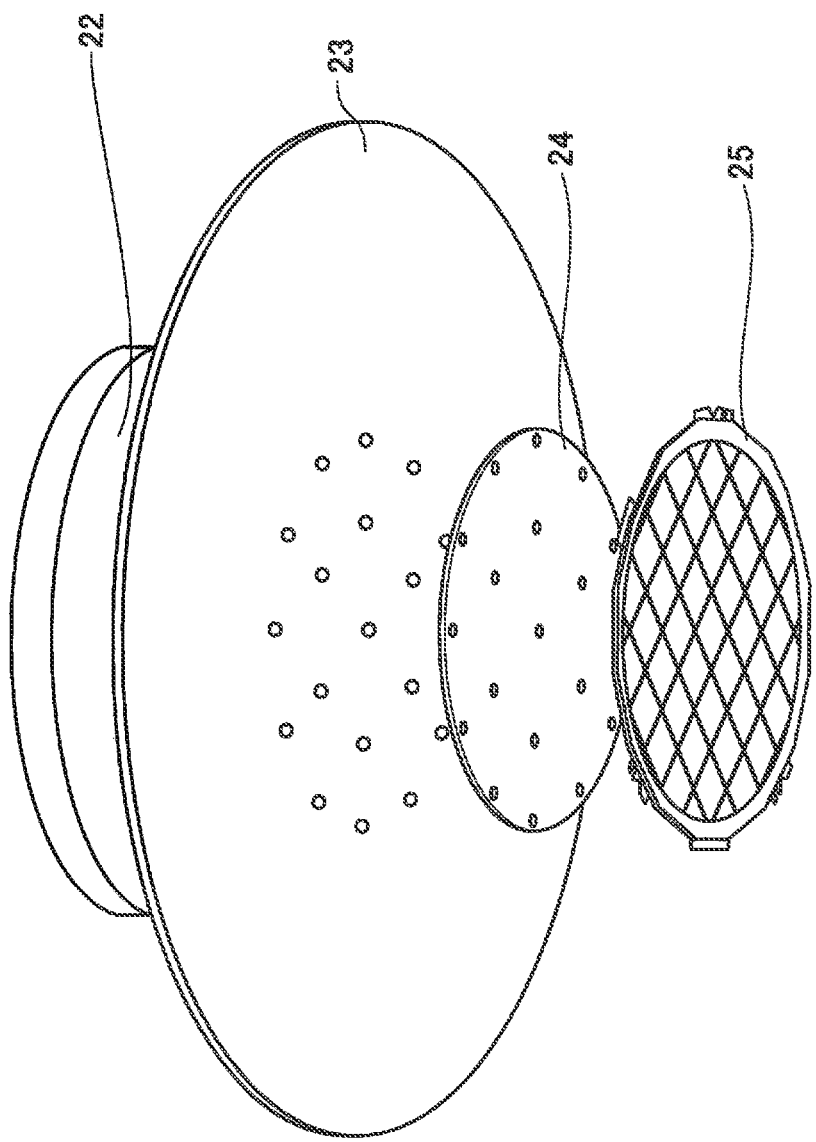
FIG. 2 is an explanatory view explaining a connection structure for connecting a probe card to the testing device side according to the embodiment.

FIG. 1 is a configuration view showing principal structures of the testing device (hereinafter also called a tester) according to the embodiment. FIG. 2 is an explanatory view explaining a connection structure far connecting a probe card to the testing device side according to the embodiment. In the following description, terms "upper" and "lower" correspond to a vertical direction shown in FIG. 1.

In FIG. 1, the principal structures of the testing device 1 according to the embodiment include a test head, 21, a support member (stiffener) 22, a wiring board 23, a connection unit 24, a probe card 25, a test stage 26, and a chuck top 27.

Test Stage 26 and Chuck Top 27

The test stage 26 is configured by combining an X stage, a Y stage, a Z stage, and a θ stage. The chuck top 27 is provided on top of the test stage 26.

The chuck top 27 is adjustable in position in an X-axis direction corresponding to a horizontal direction, a Y-axis direction perpendicular to the X axis in a horizontal plane, and a Z-axis direction perpendicular to the horizontal plane (XY plane) defined by the X axis and the Y axis. The chuck top 27 is further adjustable in attitude during rotation in the direction about the Z axis.

A placement surface 271 for placement of a test subject 28 is provided on the upper surface of the chuck top 27. In the example described in this embodiment, the test subject 28 is a semiconductor integrated circuit incorporated in a semiconductor wafer, and the semiconductor water with multiple semiconductor integrated circuits is placed on the placement surface 271.

Support Member 22

The support member 22 is to be arranged on the upper surface of the wiring board 23 and to function to stabilize the attitude of the wiring board 23. A fixing part 212 is provided at a central area of the support member 22 and the support member 22 is fixed via the fixing part 212 to the test head 21.

The wiring board 23 has a lower surface on which the connection unit 24 described later is provided. The probe card 25 is attached via the connection unit 24 to the tester side, and the tip of each probe 42 appearing on the lower surface of the probe card 25 is reliably brought into contact with each electrode of the test subject 28. To achieve this, the support member 22 is provided an the upper surface of the wiring board 23 for stabilizing the attitude of the wiring board 23 with the probe card 25 attached to the wiring board 23.

Figure 3:
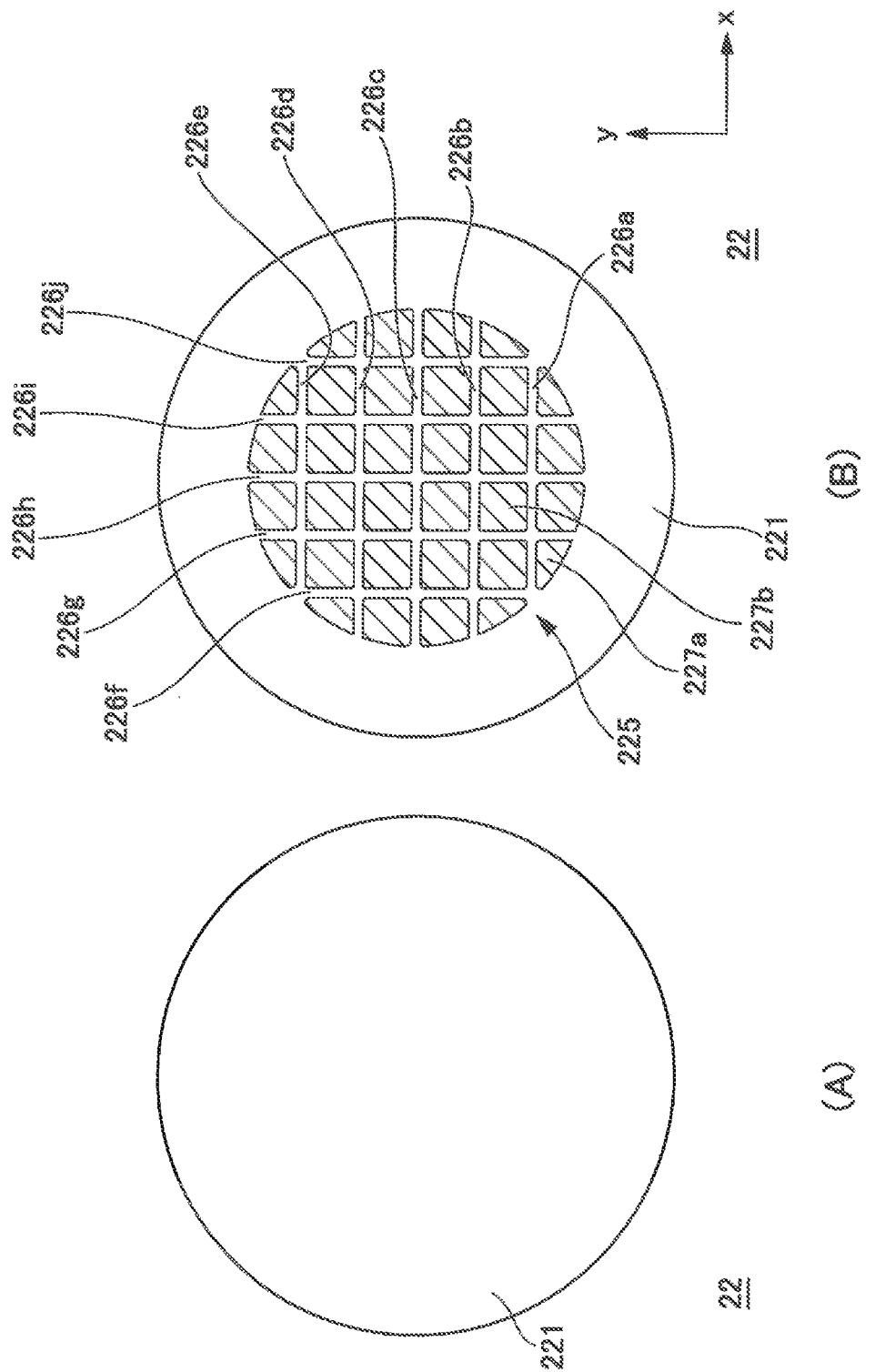
FIG. 3 is a configuration view showing the configurations of the upper surface and the lower surface of a support member according to the embodiment.

FIG. 3(A) is a configuration view showing the configuration of the upper surface of the support member 22 according to the embodiment. FIG. 3(B) is a configuration view showing the configuration of the lower surface of the support member 22 according to the embodiment.

As shown in FIGS. 3(A) and 3(B) the support member 22 includes a body 221 formed into a thick circular plate shape.

As shown in FIG. 3(A), the upper surface of the body 221 of the support member 22 is flat (level surface).

As shown in FIG. 3(B), the lower surface of the body 221 of the support member 22 is basically flat (level surface). Further, to prevent an electrode, an electronic part, etc. projecting from the upper surface of the wiring board 23 from interfering with the lower surface of the support member 22, spot-facing process (relief cutting process) is performed on a central area of the lower surface of the body 221 (lower surface central area) along the outer periphery of a circular shape and inside the circular shape to form a circular spot-facing section 225. The circular spot-facing section 225 includes equally spaced spot-faced parts 227a arranged along the outer periphery of the circular shape and each recessed into a substantially rectangular shape, and equally spaced spot-faced parts 227b formed inside the circular shape and each recessed into a square. As a result, a lattice-shaped level abutment (hereinafter also called a "level part" or a "lattice-shaped level part") 226 (226a to 226j) is formed inside the circular spot-facing section 225. In FIG. 3(B) diagonally hatched parts show the spot-faced parts 227.

The level abutments 226a to 226j forming the lattice shape and formed inside the circular spot-facing section 225 include equally spaced five level abutments 226a to 226e extending in the x-axis direction, and equally spaced five level abutments 226f to 226j extending in the y-axis direction. The level abutment 226c, located at the center of the five level abutments 226a to 226e extending in the x-axis direction, passes through the center of the body 221. Likewise, the level abutment 226h, located at the center of the five level abutments 226f to 226j extending in the y-axis direction, passes through the center of the body 221. In the example described in this embodiment, the level abutments 226a to 226j forming the lattice shape are formed inside the circular spot-facing section 225 of the support member 22. However, as long as each of multiple supports 233 described later can abut on the level abutment 226, the shape of the level abutment 226 is not limited a lattice shape. Further, instead of spot-facing process, a hole (cutout) may be formed in the circular spot-facing section 225 to penetrate the body 221 in a thickness direction.

Figure 4:
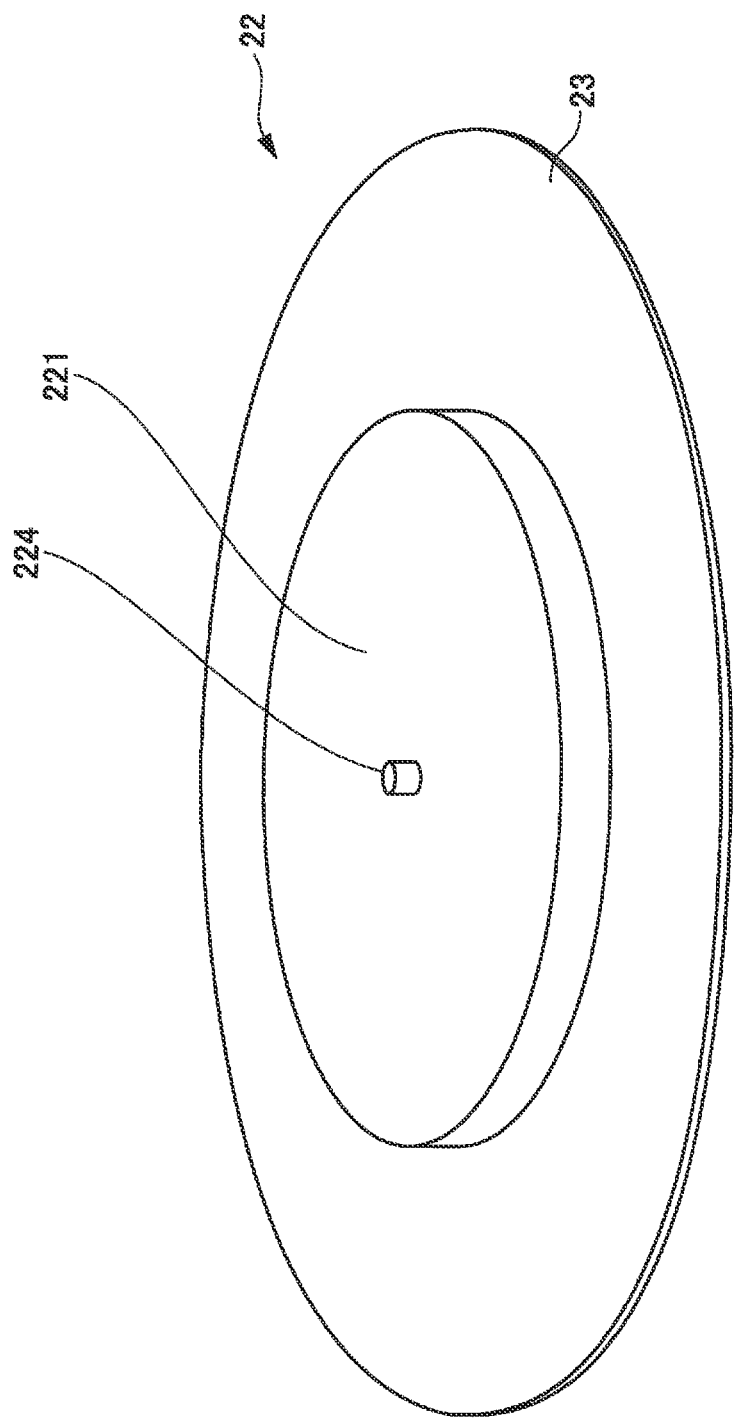
FIG. 4 is a perspective view showing the configuration of the support member arranged on a wiring board according to the embodiment.

FIG. 4 is a perspective view showing the configuration of the support member 22 arranged on the wiring board 23 according to the embodiment.

As shown in FIG. 4, the circle of the body 221 of the support member 22 has a size set to be smaller than the size of the circle of the wiring board 23. A projection 224 is provided on the upper surface of the body 221, and the projection 224 is engaged with a recess not shown, formed at the lower surface of the test head 21 to fix the support member 22 to the test head 21. This structure for connecting the support member 22 to the test head 21 is omissible.

Wiring Board 23

The wiring board 23 is a test head wiring board provided on the lower surface of the test head 21.

An electrode (not shown) is provided on the upper surface of the wiring board 23. The electrode on the upper surface of the wiring board 23 is electrically connected via multiple connections 211 to the test head 21.

A wiring pattern (not shown) is formed in the lower surface of the wiring board 23. Multiple terminal parts 231 are provided on this wiring pattern. Each of the terminal parts 231 is arranged in such as manner as to be capable of contacting an upper end portion 311 of a pogo-pin 31 functioning as a connection terminal.

Further, a wiring path (not shown) is formed inside the wiring board 23 for electrically connecting each terminal part 231 on the lower surface of the wiring board 23 to each connection 211 connected to the test head 21. Thus, the wiring board 23 can function to electrically connect the test head 21 and each pogo-pin 31 via the wiring path inside the wiring board 23.

The wiring board 23 is provided with multiple through holes 232 penetrating the wiring board 23 between the upper surface and the lower surface of the wiring board 23. The rod-shaped support 233 is inserted through each of the through holes 232. The through hole 232 may have a shape corresponding to the shape of the support 233. To allow the support 233 to be inserted through the through hole 232, the diameter of the through hole 232 is substantially equal to or slightly larger than the diameter of the support 233.

In the example described in this embodiment, the support 233 inserted through the through hole 232 is a circular columnar member having a substantially circular sectional shape. However, the support 233 is not limited to a member having this shape but can be a square columnar member having an approximate square sectional shape or a polygonal columnar member having a polygonal sectional shape, for example.

The through holes 232 at the wiring board 23 are arranged at positions corresponding to the positions of multiple anchors 251 formed on an upper surface 252 of the probe card 25 described later. The arrangement of the anchors 251 formed on the upper surface 252 of the probe card 25 will be described in detail later.

A lower end surface 235 of each support 233 inserted through a corresponding through hole 232 at the wiring board 23 abuts on an upper surface 253 of the anchor 251 on the upper surface 252 of the probe card 25. An upper end surface 234 of each support 233 is exposed slightly from the upper surface of the wiring board 23 and can abut, on the level abutment 226 of the circular spot-facing section 225 formed at the lower surface of the support member 22.

The upper end surface 234 of each support 233 having inserted through a corresponding through hole 232 functions as a reference surface for the horizontalness (parallelism) of the test head 21 side. More specifically, while the upper surface 253 of each anchor 251 on the upper surface 252 of the probe card 25 functions as a reference surface for the horizontalness (parallelism) of the probe card 25, the lower end surface 235 of each support 233 inserted through a corresponding through hole 232 abuts on the upper surface 253 of a corresponding anchor 251 to be supported on the upper surface 253, as will be described later.

In this way, the upper end surface 234 of each support 233 functions as a reference surface for the horizontalness (parallelism) of the test head 21 side so as to hold the lower surface of the test head 21 parallel to the upper surface and the lower surface of the probe card 25. Further, by the provision of each support 233, deflection of the wiring board 23 can be reduced. As a result, it becomes possible to place the tip of each probe 42 appearing on the lower surface of the probe card 25 at a height position parallel to each electrode of the test subject 28, allowing the tip of each probe 42 to reliably contact each electrode of the test subject 28.

Connection Unit 24

The connection unit 24 is a member for electrically connecting an upper end portion of each probe (probe needle) 42 of the probe card 25 described later and the multiple terminal parts 231 on the lower surface of the wiring board 23. The connection unit 24 has multiple through holes formed at positions corresponding to the positions of the multiple anchors 251 arranged on the upper surface of a probe substrate 255 described later and those of the multiple supports 233. These through holes are holes for passing corresponding ones of the multiple supports 233 therethrough. The connection unit 24 includes a pogo-pin block 30 and a pogo-pin block support 33.

The pogo-pin block 30 is a pogo-pin support member supporting multiple pogo-pins 31 to function as connection terminals. Various members are applicable to the pogo-pin block 30, as long as the multiple pogo-pins 31 can be supported by the pogo-pin block 30. The pogo-pin 31 described in the following example is a well-known pogo-pin functioning as a connection terminal, formed to be elastically deformable in are axis direction. Alternatively, instead of a pogo-pin, a well-known terminal composed of a simple rod member or plate member such as a connector is applicable to the connection terminal.

For example, the pogo-pin block 30 may be formed to be a thick circular disk-like member and provided with multiple pogo-pin insertion holes vertically penetrating the pogo-pin block 30 at positions corresponding to the positions of electrodes on the upper surface 252 of the probe card 25. The pogo-pin block 30 may also be a member in which each pogo-pin 31 is fitted into a corresponding pogo-pin insertion hole vertically penetrating the pogo-pin block 30 such that the upper end portion 311 and a lower end portion 312 of each pogo-pin 31 project from the upper surface and the lower surface of the pogo-pin block 30 respectively.

As another example, the pogo-pin block 30 may be composed of multiple (two, for example) substrates, and each substrate functioning as the pogo-pin block 30 may be provided with multiple pogo-pin insertions holes vertically penetrating the substrate at positions corresponding to the positions of the electrodes on the upper surface 252 of the probe card 25. The configuration of the pogo-pin block 30 may be such that each pogo-pin 31 is fitted into a corresponding pogo-pin insertion hole at each substrate functioning as the pogo-pin block 30 and a middle portion of each pogo-pin 31 is supported by each substrate, the upper end portion 311 of each Pogo-pin 31 is connected to the terminal part 231 on the lower surface of the wiring board 23, and the lower end portion 312 of each pogo-pin 31 is connected an electrode on the upper surface 252 of the probe card 25.

The pogo-pin block support 33 is a member provided around the pogo-pin block 30 and used for supporting the pogo-pin block 30 while attaching the pogo-pin block 30 to the wiring board 23 of the tester side. The pogo-pin block support 33 of the pogo-pin block 30 is placed in its position by the wiring board 23 and a positioning pin not shown and supported by a support mechanism not shown.

As an example, an annular groove (not shown) is provided on an upper lateral surface of the pogo-pin block support 33, and an O-ring (not shown) is attached to the annular groove. Air in internal space surrounded by the lower surface of the wiring board 23, the pogo-pin block support 33, and the upper surface 252 of the probe card 25 is exhausted by air intake and exhaust means not shown to generate a negative pressure state. Namely, the internal space is brought into a reduced pressure state. By doing so, the wiring board 23 and the probe card 25 are attracted to each other while pressing the pogo-pin 31 in a direction toward the pogo-pin block 30 to reduce a distance between the wiring board 23 and the probe card 25. At the same time, when the internal space is placed in a vacuum, the upper surface 252 of the probe card 25 is attracted in the direction toward the pogo-pin block 30 to establish abutting contact of the support 233 with the anchor 251 on the upper surface 252 of the probe card 25.

As a result, the probe 42 of the probe card 25 becomes electrically connected to the tester side via the pogo-pin 31, the terminal part 231 on the lower surface of the wiring board 23, the wiring path in the wiring board 23, the electrode (not shown) on the upper surface of the wiring board 23, and the connection 211. This brings the test subject 28 into a state ready for a test.

Various configurations are applicable to the connection unit 24. The connection unit 24 is not limited to the configuration such as that shown in FIG. 1 but a variety of configurations are widely applicable. In the example described in this embodiment, a suction method by means of pressure reduction is employed as a method of attaching the probe card 25 to the tester side, namely, a method of connecting the lower surface of the wiring board 23, the pogo-pin block support 33, and the upper surface 252 of the probe card 25. However, this is not the only applicable method and a well-known mechanical fixation structure is applicable, for example.

Probe Card 25

FIG. 5(A) is a plan view showing the configuration of the upper surface 252 of the probe card 25 according to the embodiment. FIG. 5(B) is a side view of the probe card 25 according to the embodiment.

As shown in FIG. 5(A), the probe card 25 is a plate-like member having a substantially circular or polygonal shape (hexadecagon shape, for example). The probe card 25 has an outer peripheral edge provided with engagements 51a to 51f for attachment of the probe card 25 to the testing device. A method of attaching the probe card 25 to the testing device is not particularly limited. The number of the engagements 51a to 51f or the shapes of the engagements 51a to 51f can be determined in various ways.

As shown in FIG. 5(B), the probe card 25 is composed of a multilayer wiring board 254 and the probe substrate 255 located on the upper surface of the multilayer wiring board 254.

The probe substrate 255 is made of an electrically insulating material such as ceramic, for example. An electrode terminal, to be connected to each pogo-pin 31 is formed on the upper surface 252 of the probe substrate 255. The multiple anchors 251 to abut on corresponding supports 233 of the wiring board 23 are further arranged on the upper surface 252. The arrangement of the anchors 251 formed on the upper surface 252 of the probe substrate 255 will be described in detail later.

A wiring path (not shown) is formed inside the probe substrate 255 for connecting multiple connection terminals provided on the lower surface of the probe substrate 255 and the electrode terminal on the upper surface of the probe substrate 255. The multiple connection terminals on the lower surface of the probe substrate 255 are provided at positions corresponding to the positions of upper tip portions of the multiple probes 42 appearing on the upper surface of the multilayer wiring board 254. This allows each probe 42 appearing on the upper surface of the multilayer wiring board 254 to be electrically connected to a corresponding connection terminal on the lower surface of the probe substrate 255.

The multilayer wiring board 254 is made of an electrically insulating material such as polyimide resin, for example. A substantially circular probe land (region of contacts) with the attached multiple probes 42 is provided on the lower surface of the multilayer wiring board 254. Multiple wiring paths (not shown) are formed inside the multilayer wiring board 254. These wiring paths are formed so as to associate each probe 42 in the probe land with a corresponding connection terminal on the lower surface of the probe substrate 255.

The multiple probes 42 have lower tip portions electrically contacting the electrodes of the test subject 28, and upper tip portions electrically contacting the connection terminals of the probe substrate 255. A cantilever-type electrical contact is applicable to each probe 42, for example.

Each anchor 251 is a member arranged on the upper surface 252 of the probe substrate 255 of the probe card 25 and used for supporting the support 233 inserted through the through hole 232 at the wiring board 23. Each anchor 251 is arranged at a position corresponding to the position of the lattice-shaped level abutment 226 (226a to 226j) formed in the circular spot-facing section 225 at the lower surface of the support member 22, as will be described later. As a result of such arrangement of the anchors 251, it becomes possible to support the wiring board 23 with each support 233 provided on each anchor 251 as a foundation. In this way, deformation of the wiring board 23 such as deflection can be reduced.

The height of the anchor 251 can be adjusted finely by inserting one, or two or more shims (not shown) having a predetermined thickness. The shim is a plate-like member made of stainless steel, for example. Inserting the shim between the probe substrate 255 and the anchor 251 allows the height of the anchor 251 to be adjusted finely. The height of each anchor 251 is adjusted so as to place a plane including the upper surfaces 253 of the multiple anchors 251 parallel to the upper surface 252 of the probe substrate 255.

Arrangement of Anchors 251

Figure 5:
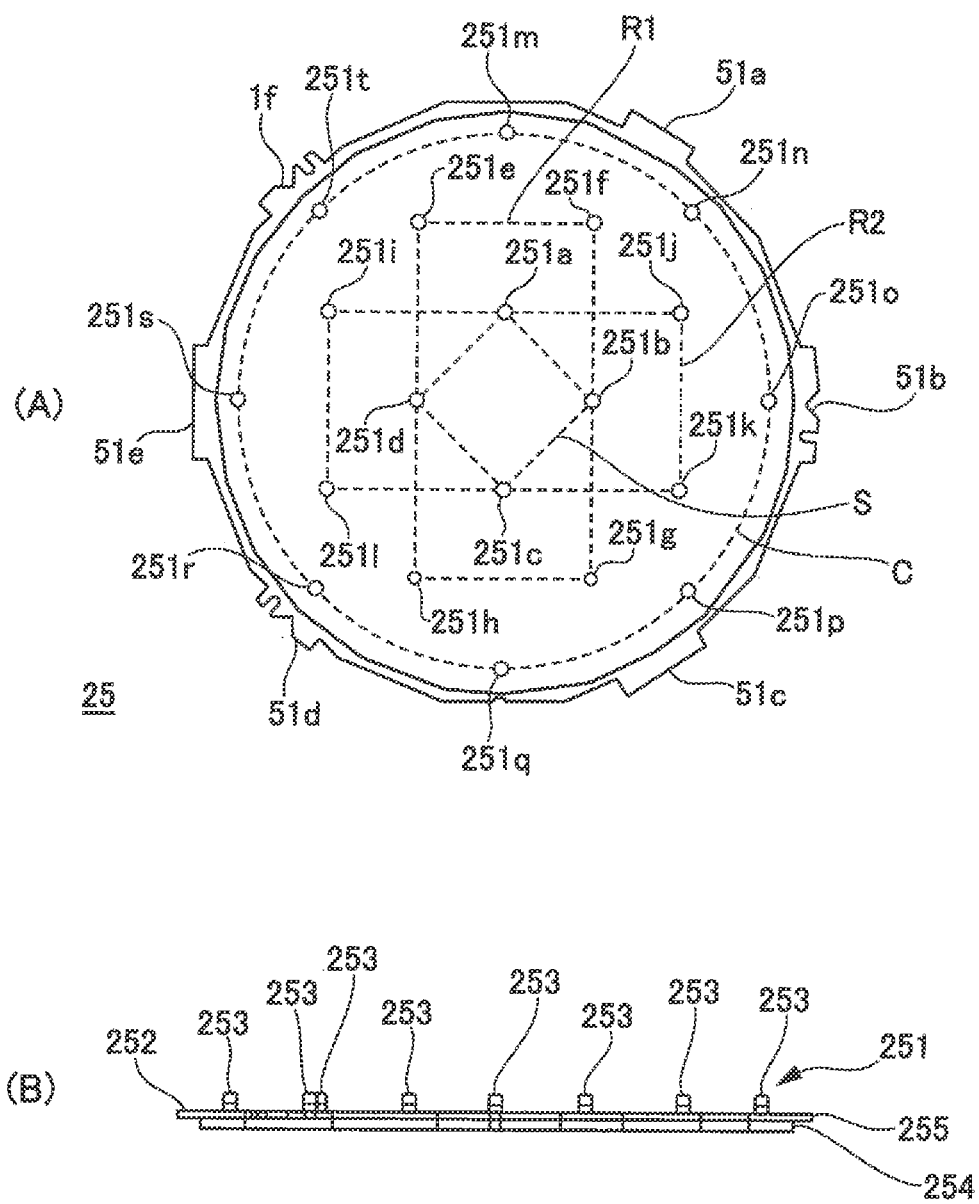
FIG. 5 shows the configurations of the upper surface and the lateral surface of the probe card according to the embodiment.

The arrangement of the anchors 251 provided on the upper surface 253 of the probe substrate 255 will be described next by referring to FIGS. 1, 5, and 6.

Figure 6:
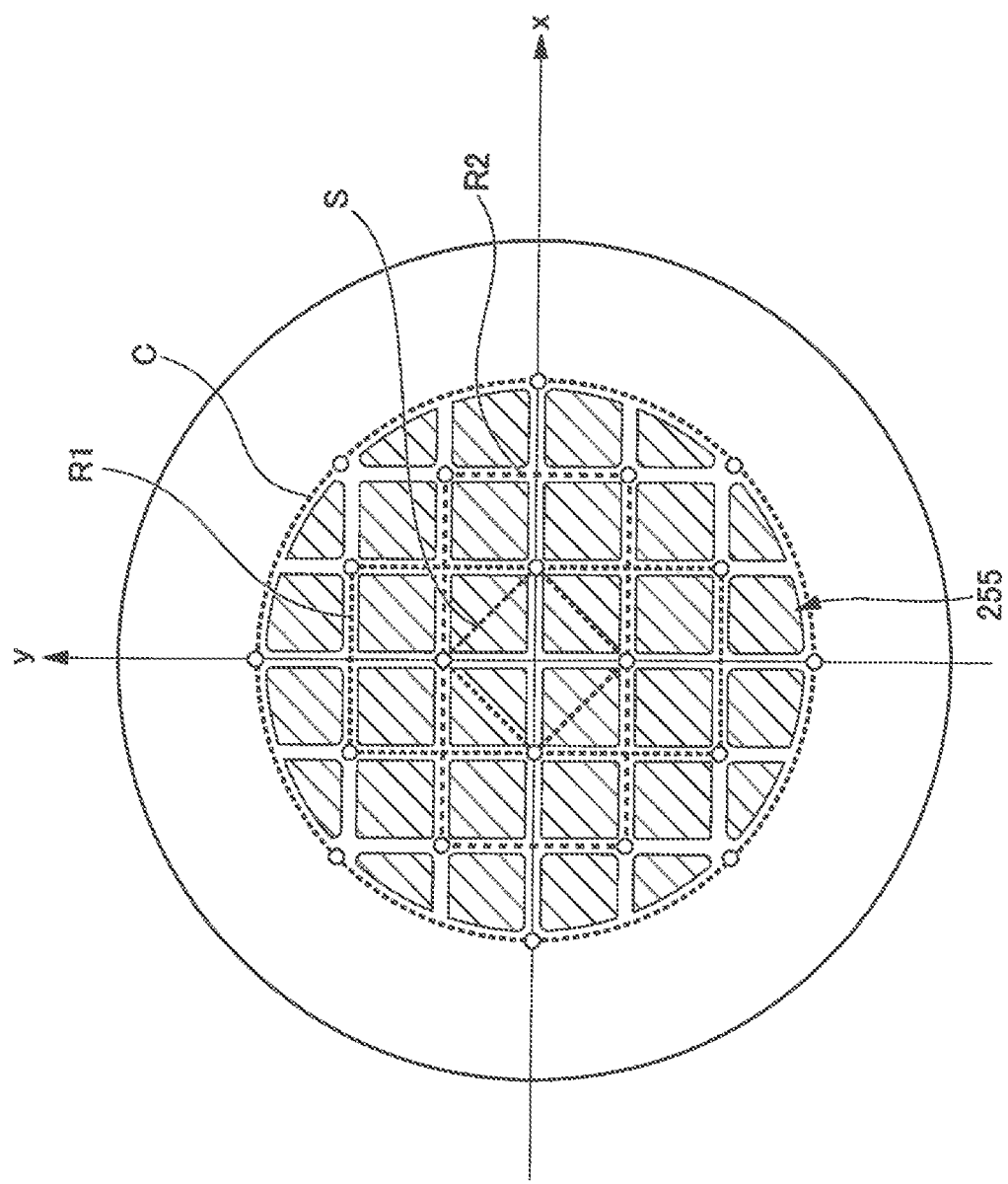
FIG. 6 is an explanatory view explaining a relationship between the configuration of a circular spot-facing section at the lower surface of the support member and the position of an anchor according to the embodiment (first explanatory view)

FIG. 6 is an explanatory view explaining a relationship between the configuration of the circular spot-facing section 225 at the lower surface of the support member 22 and the positions of the anchors 251 (first explanatory view).

To facilitate the explanation, the wiring board 23, the connection unit 24, and the probe card 25 are omitted from FIG. 6, and the positions of the anchors 251 arranged relative to the circular spot-facing section 225 of the support member 22 are shown in FIG. 6.

The support 233 is to be supported on the upper surface 253 of the anchor 251. Thus, the support 233 is also arranged at a position corresponding to the position of the anchor 251 shown in FIG. 6.

As shown in FIG. 6, the multiple anchors 251 are arranged at positions corresponding to the position of the level abutment 226 (226a to 226j) formed in the circular spot-facing section 225 at the lower surface of the support member 22. In the example described in this embodiment, a case in which twenty anchors 251 (251a to 251t) are arranged is illustrated.

The four anchors 251a to 251d of the twenty anchors 251a to 251t are arranged at vertex points of an approximate square S centered (balanced) on the center of the circular spot-facing section 225 and tilted by 45 degrees around the center. In other words, with the center of the circular spot-facing section 225 defined as the origin of an xy coordinate system, the two anchors 251a and 251c are arranged at positions separated from the origin toward a positive direction and a negative direction along the y axis respectively by a predetermined length (interval length at the level abutment 226). Further, the two anchors 251b and 251d are arranged at positions separated from the origin toward a positive direction and a negative direction along the x axis respectively by the predetermined length (interval length at the level abutment 226). The square S has a diagonal line along the x axis and a diagonal line along the y axis that intersect at a point substantially agreeing with the center of the outer periphery of the circular spot-facing section 225.

The four anchors 251e to 251h of the twenty anchors 251a to 251t are arranged at vertex points of an approximate rectangle R1 vertically long (extending lengthwise in the y-axis direction) and centered (balanced) on the center of the circular spot-facing section 225, namely, the point of intersection of the diagonal lines of the square S. The length of the long sides of the approximate rectangle R1 can be about twice the length of the diagonal lines of the approximate square S. The two long sides of the approximate rectangle R1 pass through corresponding facing vertex points of the approximate square S on one side. More specifically, of the four sides of the approximate rectangle R1 defined by the four anchors 251e to 251h, a long side (right side) connecting the anchor 251f and the anchor 251g includes the foregoing anchor 251b of the approximate square S as an approximate midpoint, and a long side (left side) connecting the anchor 251e and the anchor 251h includes the foregoing anchor 251d of the approximate square S as an approximate midpoint.

The four anchors 251i to 251l of the twenty anchors 251a to 251t are arranged at vertex points of an approximate rectangle R2 horizontally long (extending lengthwise in the x-axis direction) and centered (balanced) on the center of the circular spot-facing section 225, namely, the point of intersection of the diagonal lines of the square S. The length of the long sides of the approximate rectangle R2 can be about twice the length of the diagonal lines of the approximate square S. The two long sides of the approximate rectangle R2 pass through corresponding facing vertex points of the approximate square S on the other side. Of the four sides of the approximate rectangle R2 defined by the four anchors 251i to 251l, a long side (upper side) connecting the anchor 251i and the anchor 251j includes the foregoing anchor 251a of the approximate square S as an approximate midpoint, and a long side (lower side) connecting the anchor 251l and the anchor 251k includes the foregoing anchor 251c of the approximate square S as an approximate midpoint.

The remaining eight anchors 251m to 251t of the twenty anchors 251a to 251t are arranged along a virtual circle C near the outer periphery of the circular spot-facing section 225 at equal intervals about the center of the circular spot-facing section 225, namely, at equal angular intervals (45 degrees, for example).

The size of the diameter of the outer peripheral circle of the circular spot-facing section 225 is equal to or substantially equal to the size of the outer diameter of the semiconductor wafer as a test subject. In the illustration of FIG. 6, the diameter of the virtual circle C has a length surrounding the approximate rectangles R1 and R2 while the virtual circle C does not contact the approximate rectangles R1 and R2 and slightly larger than the diameter of the outer peripheral circle of the circular spot-facing section 225. Namely, the eight anchors 251m to 251t along the virtual circle C are arranged at positions at equal angular intervals and slightly outside of the outer peripheral circle of the circular spot-facing section 225.

As shown in the illustration of FIG. 6, by arranging the multiple anchors 251 on the upper surface 252 of the probe substrate 255 at positions corresponding to the position of the level abutment 226 of the circular spot-facing section 225 and attaching the probe card 25 to the tester side while bringing each support 233 into contact with the upper surface 253 of a corresponding anchor 251, it becomes possible to provide a larger area for arrangement of the pogo-pins 31 than in conventional cases.

More specifically, in some conventional cases, when a probe card is attached to a tester side, respective contact surfaces (reference surfaces) of the tester side and the probe card are brought into contact with each other for maintaining horizontalness. In such cases, the probe card is brought into contact with the tester side at the contact surface of the probe card, making it difficult to increase the number of pogo-pins.

In contrast, according to this embodiment, the probe card 25 can be attached to the wiring board 23 via the multiple (twenty) supports 233 as circular columnar members, for example, to provide a larger area for arrangement of the pogo-pins 31 than in the conventional cases. This makes it possible to increase the number of pogo-pins 31 to be arranged compared to the conventional cases, while making it possible to increase the number of measured DUTs. Further, for forming surface contact of the probe card 25, the probe card 25 is attached to the tester side via the anchor 251 and the support 233, making it possible to reduce the occurrence of break, etc. of the probe substrate 255.

In this embodiment, when the probe card 25 is attached to the connection unit 24, the upper surface 253 of each anchor 251 functions as a reference surface for adjusting the position of the probe card 25. Further, as the lower end surface 235 of the support 233 is supported on the upper surface 253 of the anchor 251, the upper end surface 234 of the support 233 functions as a reference surface for adjusting the position of the tester side. As a result, it becomes possible to maintain the horizontalness of the lower surface of the test head 21, that of the lower surface of the wiring board 23, and that of the lower surface of the probe card 25, so that these lower surfaces can be provided in parallel to each other.

Further, the anchor 251 and the support 233 are arranged at positions corresponding to the position of the level abutment 226 of the circular spot-facing section 225. By doing so, when the probe card 25 is fitted to the tester via the connection unit 24, the probe card 25 can be fitted stably to the wiring board 23 via the anchor 251 and the support 233.

By attaching the probe card 25 to the wiring board 23 via the anchor 251 and the support 233, the probe substrate 255, which is made of ceramic, for example, can be increased in thickness by about 20 to about 30%. As a result, it becomes possible to reduce deformation (deflection, for example) of the probe card 25.

Figure 7:
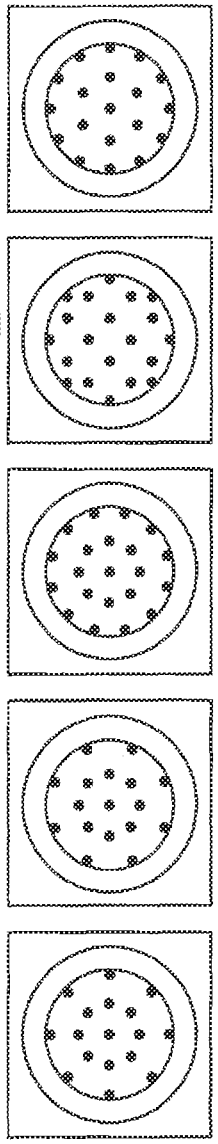
FIG. 7 shows an FEM analysis result indicating a degree of deformation (displacement difference) of the probe card occurring when the probe card is attached to the tester side via the anchor and a support according to the embodiment (first analysis result)

FIG. 7 shows an FEM analysis result indicating a degree of deformation (displacement difference) of the probe card 25 occurring when the probe card 25 is attached to the tester side via the anchor 251 and the support 233.

In FIG. 7, a degree of deformation of the support member 22 and that of the probe card 25 are analyzed by the FEM by changing condition items including "contact load," "connection unit thickness," "presence or absence of support 233," "the number of supports 233," and "arrangement of anchor 251 and support 233."

In particular, the condition items "the number of supports 233" and "arrangement of anchor 251 and support 233" are chanced between conditions 1 to 5.

"Contact load" is a load applied for bringing the probe card 25 into contact with the test subject 28 using the tester side and corresponds to reaction force in an upward direction applied from the lower side of the probe card 25. In this example, "contact load" is "2.942 N (=300 kgf)" under all the conditions 1 to 5, for example.

Under all the conditions 1 to 5, "thickness of connection unit" is "5.1 mm" and "presence or absence of support 233" is "yes."

Under the condition 1, seventeen anchors 251 and seventeen supports 233 are used, one anchor 251 and one support 233 are arranged at the center of the circular spot-facing section 225, eight anchors 251 and eight supports 233 are arranged at equal angular intervals along the outer peripheral circle of the circular spot-facing section 225, and eight anchors 251 and eight supports 233 are arranged at equal angular intervals along a circle having a radius half the radius of this outer peripheral circle.

Under the condition 2, seventeen anchors 251 and seventeen supports 233 are used, one anchor 251 and one support 233 are arranged at the center of the circular spot-facing section 225, eight anchors 251 and eight supports 233 are arranged at equal angular intervals along the outer peripheral circle of the circular spot-facing section 225, and eight anchors 251 and eight supports 233 are arranged at equal angular intervals along a circle having a radius half the radius of this outer peripheral circle. Further, the eight anchors 251 and the eight supports 233 along the outer peripheral circle are arranged at angular positions shifted from the eight anchors 251 and the eight supports 233 along the inner circle. The condition 2 differs in this point from the condition 1.

Under the condition 3, twenty one anchors 251 and twenty one supports 233 are used, one anchor 251 and one support 233 are arranged at the center of the circular spot-facing section 225, twelve anchors 251 and twelve supports 233 are arranged at equal angular intervals along the outer peripheral circle of the circular spot-facing section 225, and eight anchors 251 and eight supports 233 are arranged at equal angular intervals along a circle having a radius half the radius of this outer peripheral circle.

The condition 4 corresponds to the arrangement of the anchors 251 and that of the supports 233 according to this embodiment. As illustrated in FIG. 6, twenty anchors 251 and twenty supports 233 are arranged.

Under the condition 5, nineteen anchors 251 and nineteen supports 233 are used, one anchor 251 and one support 233 are arranged at the center of the circular spot-facing section 225, twelve anchors 251 and twelve supports 233 are arranged at equal angular intervals along the outer peripheral circle of the circular spot-facing section 225, and six anchors 251 and six supports 233 are arranged at equal angular intervals along a circle having a radius half the radius of this outer peripheral circle.

Comparing the results obtained under the conditions 1 to 5 indicated in the FEM analysis result in FIG. 7 shows that all the conditions 3, 4, and 5 produce favorable results generating smaller in-plane displacement differences of the probe card 25 than those under the conditions 1 and 2. Further, comparing the results obtained under the conditions 3 to 5 shows that the condition 4 produces the most favorable result generating the small in-plane displacement difference of the probe card 25. This shows that the deformation (deflection, for example) of the probe card 25 is minimized and the horizontalness (parallelism) of the probe card 25 is maintained at the highest level under the condition 4. In other words, arranging twenty anchors 251 and twenty supports 233 in the pattern shown in FIG. 6 under the condition 4 makes it possible to bring the probe 42 of the probe card 25 into electrical contact with the test subject 28 reliably.

Optimization of Arrangement of Anchors 251 and Supports 233

The FEM analysis result provided in FIG. 7 shows that arranging twenty anchors 251 and twenty supports 233 in the pattern shown in FIG. 6 under the condition 4 makes it possible to reduce a displacement difference of the probe card 25.

In the following description, FEM analysis is conducted by changing the arrangement of the anchors 251 and the supports 233 to encourage optimization of the anchors 251 and the supports 233.

FIG. 8 shows a result of the FEM analysis indicating a degree of deformation (displacement difference) of the probe card 25 occurring when the probe card 25 is attached to the tester via twenty anchors 251 and twenty supports 233.

In this case, a degree of deformation of the support member 22 and that of the probe card 25 are analyzed by the FEM by changing a condition item "position of support 233 on outermost periphery (along virtual circle)."

Under a condition 4-1, the twenty anchors 251 and the twenty supports 233 are arranged in the pattern shown in FIG. 6.

Figure 9:
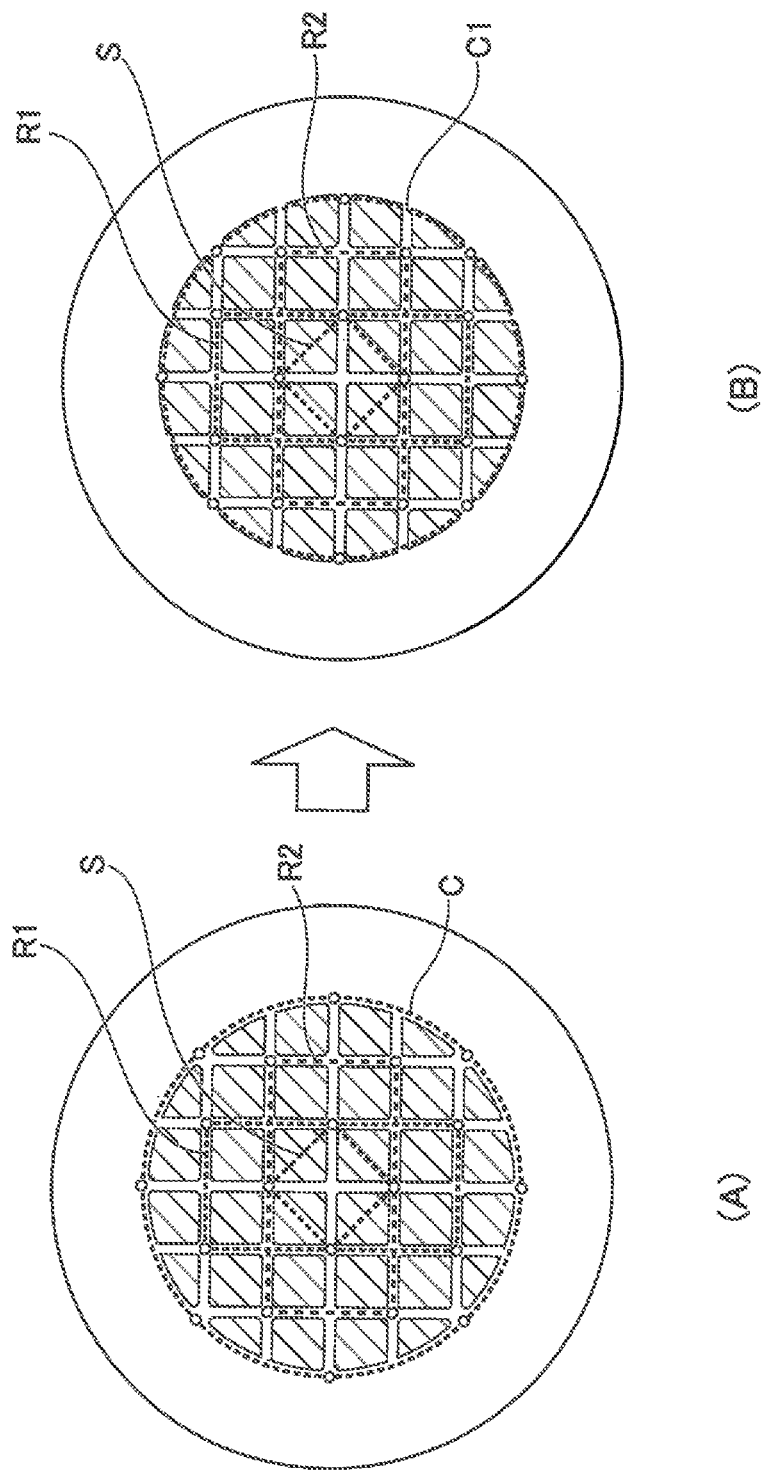
FIG. 9 is an explanatory view explaining a relationship between the configuration of the circular spot-facing section at the lower surface of the support member and the position of the anchor according to the embodiment (second explanatory view).

In contrast, under a condition 4-2, the twenty anchors 251 and the twenty supports 233 are arranged in a pattern shown in FIG. 9(B). The arrangement of these anchors 251 corresponding to the arrangement of the anchors 251 in FIG. 6 is shown in FIG. 9(A) to clarify the difference from FIG. 9(B).

Similarly to the arrangement illustrated in FIG. 6, in the arrangement in FIG. 9(B), the twenty anchors 251 are arranged at positions corresponding to the position of the level abutment 226 (226a to 226j) formed in the circular spot-facing section 225 at the lower surface of the support member 22.

The arrangement of the twelve anchors 251a to 251l of the twenty anchors 251a to 251t is the same as that shown in FIG. 6, so that this arrangement will not be described in detail here.

The remaining eight anchors 251m to 251t of the twenty anchors 251a to 251t are arranged at equal angular intervals along a virtual circle C1 having a diameter slightly shorter than the diameter of the outer peripheral circle of the circular spot-facing section 225. In other words, in the arrangement shown in FIG. 9(B), the eight anchors 251m to 251t on the outermost periphery of the twenty anchors 251a to 251t are located at positions inside of the outer peripheral circle of the circular spot-facing section 225.

As understood from the foregoing, it could be confirmed that locating the anchors 251m to 251t on the outermost periphery of the twenty anchors 251 and the twenty supports 233 at the positions inside of the outer peripheral circle of the circular spot-facing section 225 is more preferable in minimizing deformation (deflection, for example) of the probe card 25 and maintaining the horizontalness (parallelism) of the probe card 25 at the highest level.

(A-2) Effect of Embodiment

As described above, according to this embodiment, the multiple anchors and the multiple supports supported on the upper surfaces of corresponding ones of the anchors are arranged at predetermined positions on the upper surface of the probe substrate and brought into abutting contact with the lattice-shaped level abutment formed in the circular spot-facing section at the lower surface of the support member. This makes it possible to increase the number of connection terminals such as pogo-pins while reducing deformation (deflection, for example) of the probe card. As a result, it becomes possible to increase the number of DUTs to be measured using the testing device.

According to this embodiment, the probe substrate of the probe card can be made thicker than in conventional cases. Further, the number of the anchors and that of the supports, and the arrangement of the anchors and that of the supports are optimized, making it possible to maintain the horizontalness (parallelism) of the probe card favorably.

According to this embodiment, a member such as a shim is added to or extracted from each anchor arranged on the upper surface of the probe substrate to make the height of each anchor adjustable, making it possible to adjust the horizontalness (parallelism) of the probe card.

According to this embodiment, when the probe card is attached to the testing device (tester) side, the probe card is attached to the wiring board side via the anchor and the support. This makes it possible to reduce a risk of break of the probe substrate made of ceramic, for example.

REFERENCE SINGS LIST

1 . . . Testing device, 21 . . . Test head, 22 . . . Support member, 23 . . . ring board, 24 . . . Connection unit, 25 . . . Probe card, 26 . . . Test stage, 27 . . . Chuck top, 28 . . . Test stage, 30 . . . Pogo-pin block, 31 . . . Pogo-pin, 33 . . . Pogo-pin block support, 42 . . . Probe, 51a to 51f . . . Engagement, 211 . . . Connection, 224 . . . Projection, 225 . . . Circular spot-facing section, 226 (226a to 226j) . . . Level abutment, 227 . . . Spot-faced part, 231 . . . Terminal part, 232 . . . Through hole, 233 . . . Support, 234 . . . Upper end surface, 235 . . . Lower end surface, 251 (251a to 251t) . . . Anchor, 252 . . . Upper surface, 253 . . . Upper surface, 254 . . . Multilayer wiring board, 255 . . . Probe substrate, 271 . . . Placement surface, 311 . . . Upper end portion, 312 . . . Lower end portion

The invention claimed is:

1. An electrical connecting apparatus comprising a support member having a lower surface region in which a level part is formed and a wiring board provided adjacent to the lower surface of the support member, and to be connected to a testing device side, the electrical connecting apparatus comprising:
   a connection unit provided adjacent to the lower surface of the wiring board and having multiple connection terminals;
   a probe substrate provided adjacent to the lower surface of the connection unit and electrically connecting multiple probes to electrically contact a test subject to the multiple connection terminals;
   multiple anchors arranged on the upper surface of the probe substrate; and
   multiple supports functioning as supports between corresponding ones of the multiple anchors on the probe substrate and the level part of the support member via through holes at the wiring board and through holes at the connection unit, wherein
   the multiple anchors and the multiple supports are arranged at positions including:
   each vertex point of a square;
   each vertex point of a first rectangle having two long sides passing through corresponding facing vertex points of the square on one side;
   each vertex point of a second rectangle having two long sides passing through corresponding facing vertex points of the square on the other side; and
   multiple points located at equal intervals along a virtual circle centered on a point of intersection of the diagonal lines of the square and having a diameter of a size surrounding the first rectangle and the second rectangle,
   wherein the support member has a circular spot-facing section in which the level part is formed into a lattice shape in the lower surface region, the anchor at each vertex point of the square, the anchor at each vertex point of the first rectangle, and the anchor at each vertex point of the second rectangle are arranged at positions corresponding to the position of the lattice-shaped flat part in the circular spot-facing section, and the virtual circle is formed to correspond the outer periphery of the circular spot-facing section, wherein the anchors and the supports along the virtual circle belonging to the multiple anchors and the multiple supports are arranged slightly inside of the outer periphery of the circular spot-facing section.

2. The electrical connecting apparatus according to claim 1, wherein each of the long sides of the first rectangle and each of the long sides of the second rectangle have a length about twice the length of the diagonal lines of the square.

3. The electrical connecting apparatus according to claim 1, wherein the outer periphery of the circular spot-facing section has a diameter of a size equal to or substantially equal to the size of the outer diameter of a test subject having a circular plate shape.

4. The electrical connecting apparatus according to claim 1, wherein each of the multiple anchors is adjustable in height.

* * * * *